(12) United States Patent
Menkus et al.

(10) Patent No.: US 7,236,115 B1
(45) Date of Patent: Jun. 26, 2007

(54) DISTRIBUTED CURRENT SOURCES FOR FOLDING ADC AMPLIFIER STAGES

(75) Inventors: Christopher A. Menkus, San Diego, CA (US); Robert Callaghan Taft, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 353 days.

(21) Appl. No.: 10/763,561

(22) Filed: Jan. 22, 2004

(51) Int. Cl.
 *H03M 1/66* (2006.01)
(52) U.S. Cl. .................... 341/145; 341/144; 341/136
(58) Field of Classification Search ............... 341/155, 341/156, 118, 120, 145, 136; 330/252, 51, 330/295, 253
See application file for complete search history.

(56) References Cited

U.S. PATENT DOCUMENTS

| | | | | |
|---|---|---|---|---|
| 5,126,742 A | * | 6/1992 | Schmidt et al. ............. | 341/156 |
| 5,307,067 A | * | 4/1994 | Kimura et al. .............. | 341/159 |
| 5,640,163 A | * | 6/1997 | Nauta et al. ................ | 341/155 |
| 5,905,452 A | * | 5/1999 | Baek ........................... | 341/136 |
| 6,100,836 A | * | 8/2000 | Bult ............................ | 341/155 |
| 6,157,257 A | * | 12/2000 | Murphy ...................... | 330/252 |
| 6,339,391 B1 | * | 1/2002 | Chung et al. ............... | 341/153 |
| 6,570,522 B1 | * | 5/2003 | Galambos et al. .......... | 341/155 |

* cited by examiner

*Primary Examiner*—Linh V. Nguyen
(74) *Attorney, Agent, or Firm*—Darby & Darby P.C.; Matthew M. Gaffney (57) ABSTRACT

A circuit for reducing the maximum magnitude of the total current on each of a plurality of buses for an amplifier stage in a folding analog to digital converter. Each amplifier stage bus couples multiple transconductance circuits to a load. Also, each of the transconductance circuits is configured to output a separate transconductance current to its respective bus. Separate current source circuits are configured to provide a separate source current locally at the output of each of the transconductance circuits such that substantially less than the full amount of each transconductance current reaches the respective bus.

24 Claims, 6 Drawing Sheets

DISTRIBUTED CURRENT SOURCES FOR FOLDING ADC AMPLIFIER STAGES

FIELD OF THE INVENTION

The invention is related to folding analog-to-digital converters, in particular, the invention is related to current sources distributed along a bus of an amplifier stage for a folding analog-to-digital converter circuit.

BACKGROUND OF THE INVENTION

An analog-to-digital converter (ADC) is employed to change/convert an analog input signal into a digital output signal. There are several different types of ADCs in current use, including pipeline, flash and folding. For pipeline ADCs, separate decoding stages are arranged in a pipeline to convert the analog signal into a digital signal.

In a flash ADC, k bits of resolution employ $2^k$ comparators to convert an analog signal into a digital signal. Folding ADCs are a variation of a typical flash ADC architecture except that they are arranged to map the analog input signal range into N regions where each of these N regions share the same comparators. In a folding ADC, the total number of comparators is typically $2^k/N$. Also, a folding ADC includes a coarse channel for determining from which of the N input regions the analog input signal originated. Usually, the coarse channel is configured to use coarse reference voltages that are spaced according to the voltage spacing between each folding region.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The phrase "in one embodiment," as used herein does not necessarily refer to the same embodiment, although it may. The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a circuit for reducing the maximum magnitude of the total current on each of a plurality of buses for an amplifier stage in a folding analog to digital converter. Each amplifier stage bus couples multiple transconductance circuits to a load. Also, each of the transconductance circuits is configured to output a separate transconductance current to its respective bus. Separate current source circuits are configured to provide a separate source current locally at the output of each of the transconductance circuits such that substantially less than the full amount of each transconductance current reaches the respective bus.

In one embodiment, if the transconductance current is sinking, the corresponding current source circuit locally provides a sourcing current that is less than the maximum sinking current. In another embodiment, if the transconductance current is sourcing, the corresponding current source circuit locally provides a sinking current that is less than the maximum sourcing current. In this way, the transconductance circuits can operate over their full range, but the maximum total current carried over the bus to the load circuit is reduced. Additionally, in another embodiment, separate current sources could be provided for fewer than all of the transconductance circuits.

Figure 1:
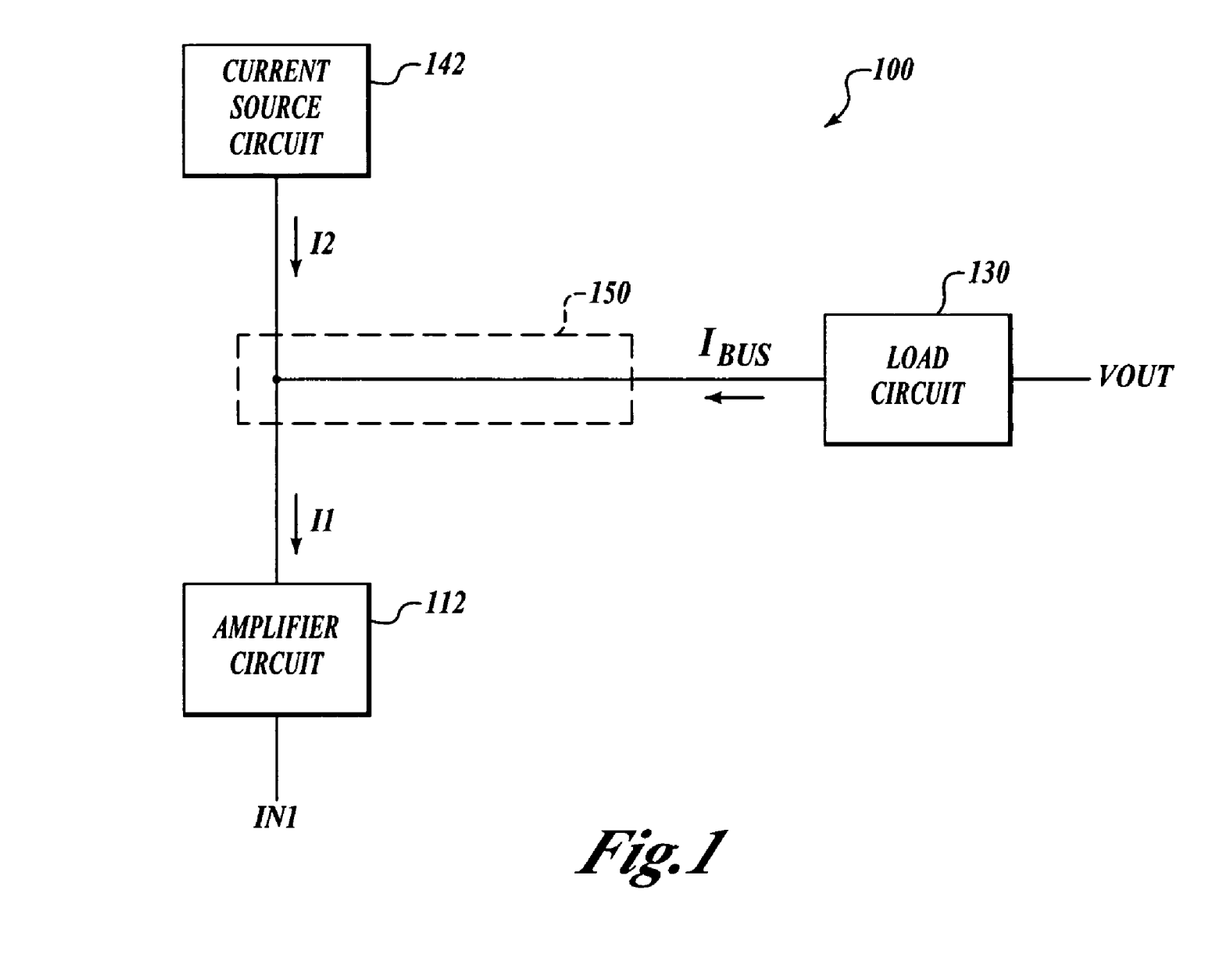
FIG. 1 illustrates a block diagram of a circuit.

FIG. 1 illustrates a block diagram of an embodiment of a circuit (100) that includes an amplifier circuit (112), a bus (150), a load circuit (130), and a current source circuit (142). Bus 150 couples amplifier circuit 112 to load circuit 130.

Amplifier circuit 112 is configured to provide sink current I1 to bus 150 in response to an input signal (IN1). Current source circuit 142 is arranged to provide source current I2 locally to an output of amplifier circuit 112 such that at least a portion of sink current I1 is not carried by bus 150 for load circuit 130. Also, load circuit 130 is configured to provide an output voltage (Vout) in response to a total bus current ($I_{bus}$).

In one embodiment, currents I1 and I2 are both differential currents. However, in another embodiment, currents I1 and I2 may both be single-ended currents.

In one embodiment, signals IN1 and Vout may each be differential voltages. Alternatively, in another embodiment, one or both of signals IN1 and Vout may be a different type of signal.

Amplifier circuit 112 is configured to provide an amount of current that depends on signal IN1 and ranges from 0 to Imax. According to one embodiment, amplifier circuit 112 includes a tail current source that is configured to provide a tail current that is equal to Imax. Current source circuit 142 is configured to provide a pre-determined amount of current that is equal to Imax/x, where x is greater than one.

The total amount of sink current that amplifier circuit 112 can be provide to bus 150 is I2−Imax/x. Since I2 ranges from 0 to Imax, the current provided to bus 150 by amplifier circuit 112 ranges from −Imax/x to Imax−Imax/x. Accordingly, the maximum magnitude of current that is provided to bus 150 by amplifier circuit 112 is less than Imax.

The median lifetime of a bus is inversely proportional to current density and temperature on the bus. Current source circuit 142 is arranged to reduce the maximum magnitude of $I_{bus}$. By decreasing the maximum magnitude of $I_{bus}$, the maximum current density of bus 150 may be decreased without increasing the width of bus 150. By reducing the maximum current density on bus 150, the lifetime of the bus can be substantially improved. This is particularly useful in devices that include relatively high conversion speeds and high levels of integration, which leads higher die temperatures.

In one embodiment, current I2=Imax/2. Accordingly, the current from amplifier circuit 112 that reaches bus 150 would range from −Imax/2 to +Imax/2. In this embodiment, the maximum magnitude of current that is provided to bus 150 by amplifier circuit 112 is Imax/2.

Figure 2:
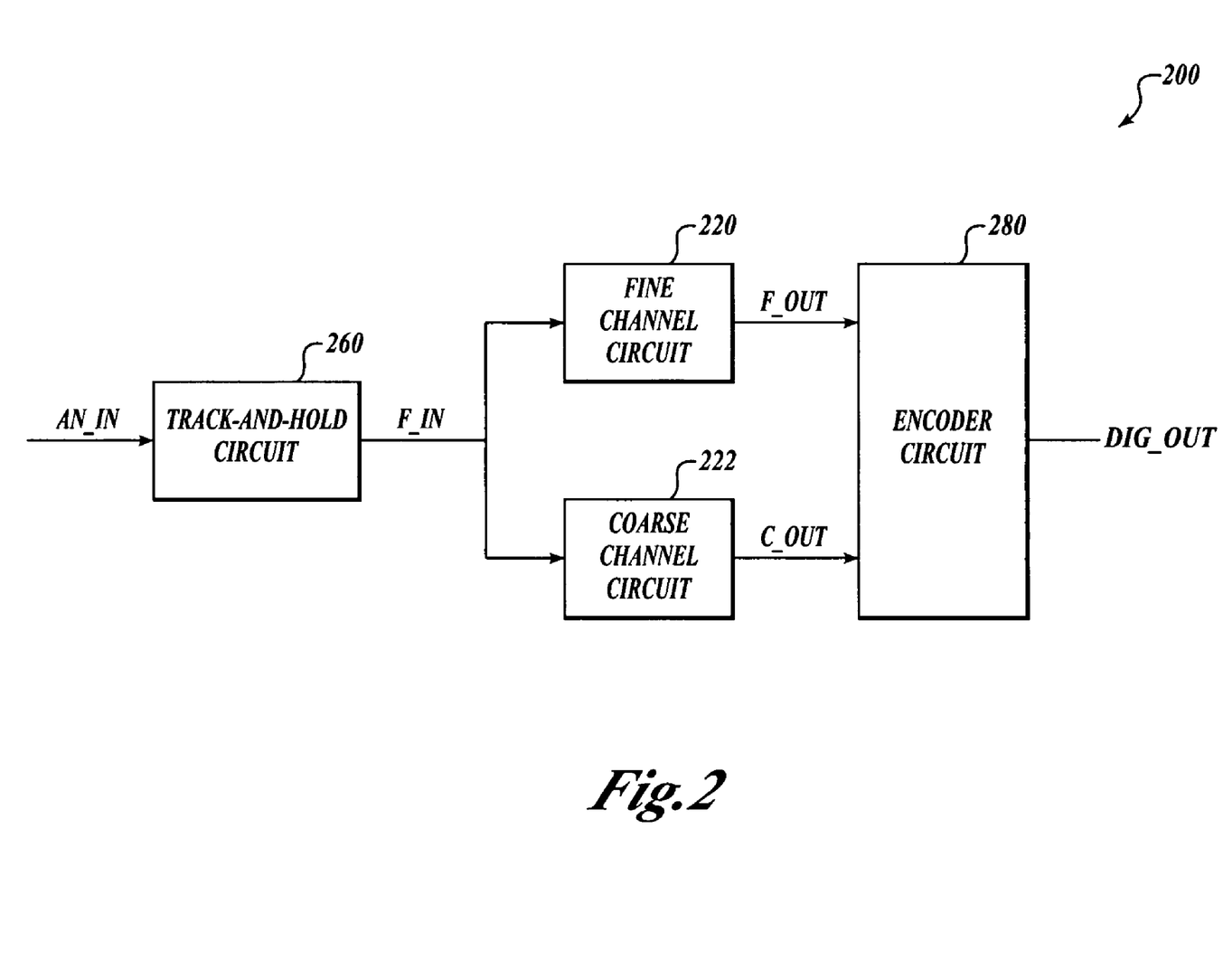
FIG. 2 shows a block diagram of a folding analog-to-digital converter circuit.

FIG. 2 shows a block diagram of a folding analog-to-digital converter circuit (200). Circuit 200 includes a track-and-hold circuit (260), a fine channel circuit (220), a coarse channel circuit (222), and an encoder circuit (280).

Track-and-hold circuit 260 is configured to sample-and-hold an analog input signal (AN_IN) to provide a fine channel input signal (F_IN). One embodiment of track-and-hold circuit 260 could be a switched capacitor circuit, and the like. Fine channel circuit 220 includes folding stages. Fine channel circuit 220 is configured to convert signal F_IN to a fine channel output signal (F_OUT), and coarse channel circuit 222 is configured to convert signal F_IN into a coarse channel output signal (C_OUT). Encoder circuit 280 is configured to convert signals F_OUT and C_OUT into a digital output signal (DIG_OUT).

Figure 3:
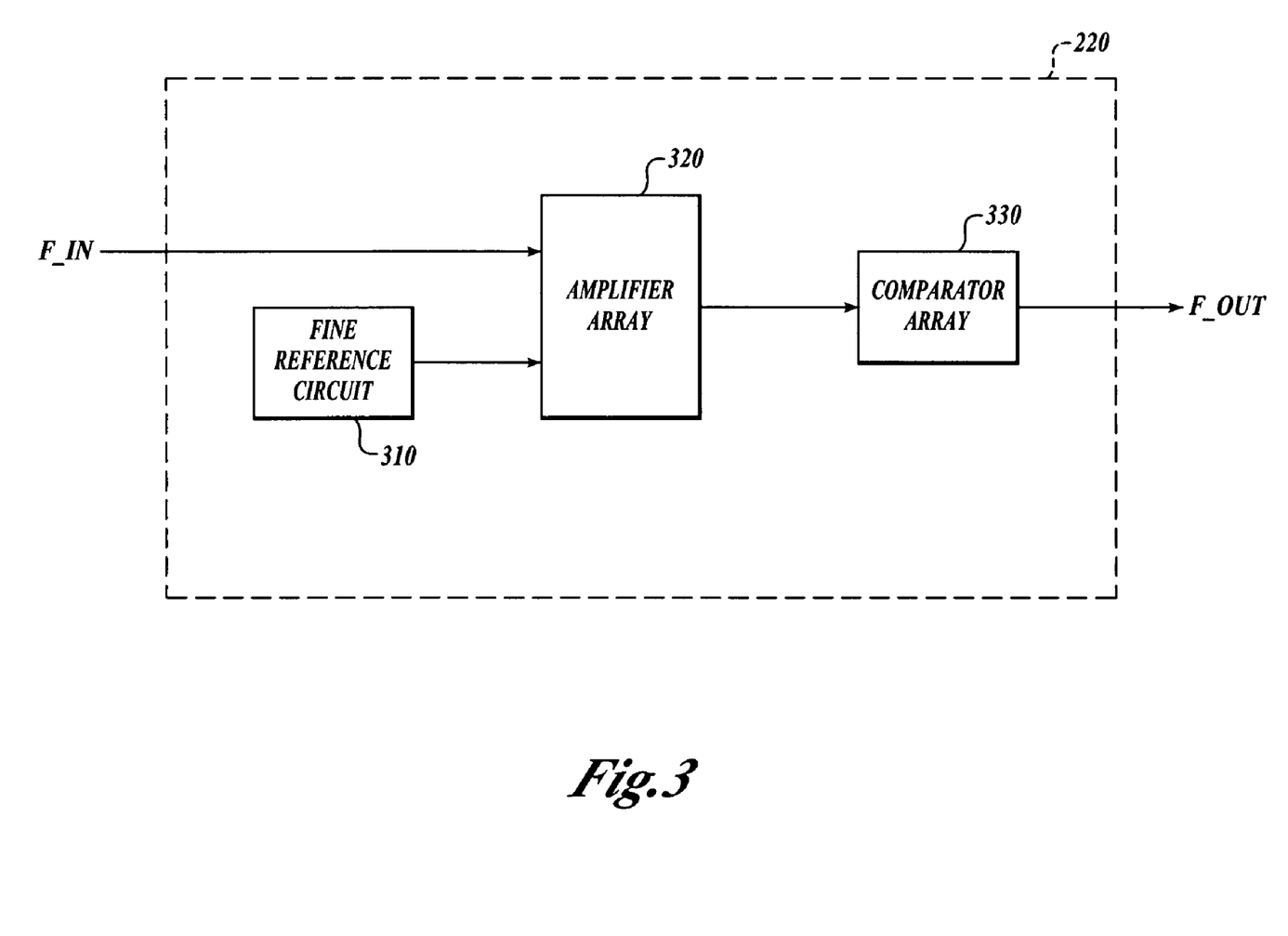
FIG. 3 illustrates a block diagram of an embodiment of the fine channel circuit of FIG. 2.

FIG. 3 illustrates a block diagram of an embodiment of fine channel circuit 220. In this embodiment, fine channel circuit 220 includes a fine reference circuit (310), an amplifier array (320), and a comparator array (330). Amplifier array 320 includes an array of amplifiers, and comparator array 330 includes an array of comparators. Fine reference circuit 310 is configured to provide a plurality of reference voltages. Fine reference circuit 310 may include a resistor ladder, other means of generating reference voltages, and the like. Although only one amplifier array is shown in FIG. 3, in another embodiment, fine channel circuit 220 may contain one or more additional amplifier arrays, and the like. One or more of the additional amplifier array stages may use averaging/interpolating resistors, and the like, to provide additional reference voltages.

Figure 4:
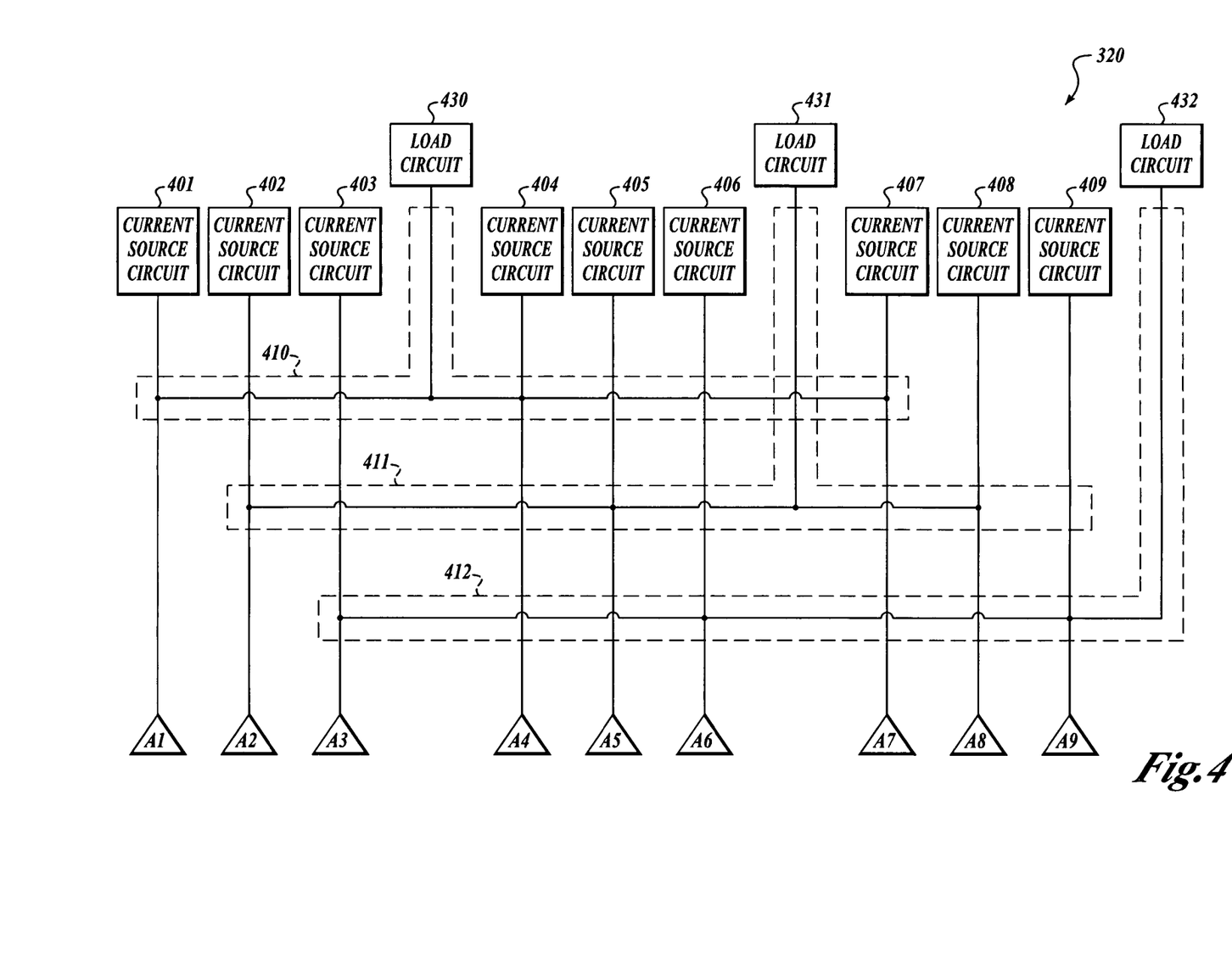
FIG. 4 shows a block diagram of an embodiment of part of the amplifier array of FIG. 3.

FIG. 4 shows a block diagram of an embodiment of amplifier array 320. In this embodiment, amplifier array 320 includes amplifier circuits (A1–A9), load circuits (430, 431 and 432), buses (410, 411 and 412), and current source circuits (401–409).

Amplifiers circuits A1, A4, and A7 are coupled to load circuit 430 via bus 410. Amplifiers circuits A2, A5, and A8 are coupled to load circuit 431 via bus 411. Amplifiers circuits A3, A6, and A9 are coupled to load circuit 432 via bus 412. Each of the amplifier circuits A1–A9 is configured to provide a current to the bus that it is coupled to.

The buses (410–412) allow each of the amplifiers making up a folding node to supply current to the same load. Because each of the amplifiers connected to any one bus are physically separated from each other, the bus between them can be relatively long, adding parasitic capacitance to ground and to neighboring buses. Each of the current source circuits 401–409 is configured to provide a current locally to the output of a respective one of each of the amplifier circuits A1–A9. In this way, at least a portion of the current provided by each of the amplifier circuits A1–A9 is not carried on the buses 410–412 to the respective load circuits 430, 431 and 432.

In one embodiment, each of the amplifier circuits A1–A9 is configured to provide a differential current in response to a differential input signal, and each of the current sources is configured to provide a differential current. In another embodiment, some or all of the signals may be single-ended signals.

An embodiment of amplifier array 320 is shown in FIG. 4 which includes three load circuits (430, 431, and 432) with three amplifier circuits coupled to each load circuit. However, in other embodiments, virtually any number of load circuits may be included in amplifier array 320, and virtually any number of amplifier circuits may be coupled to each load circuit without departing from the spirit and scope of the invention.

Figure 5:
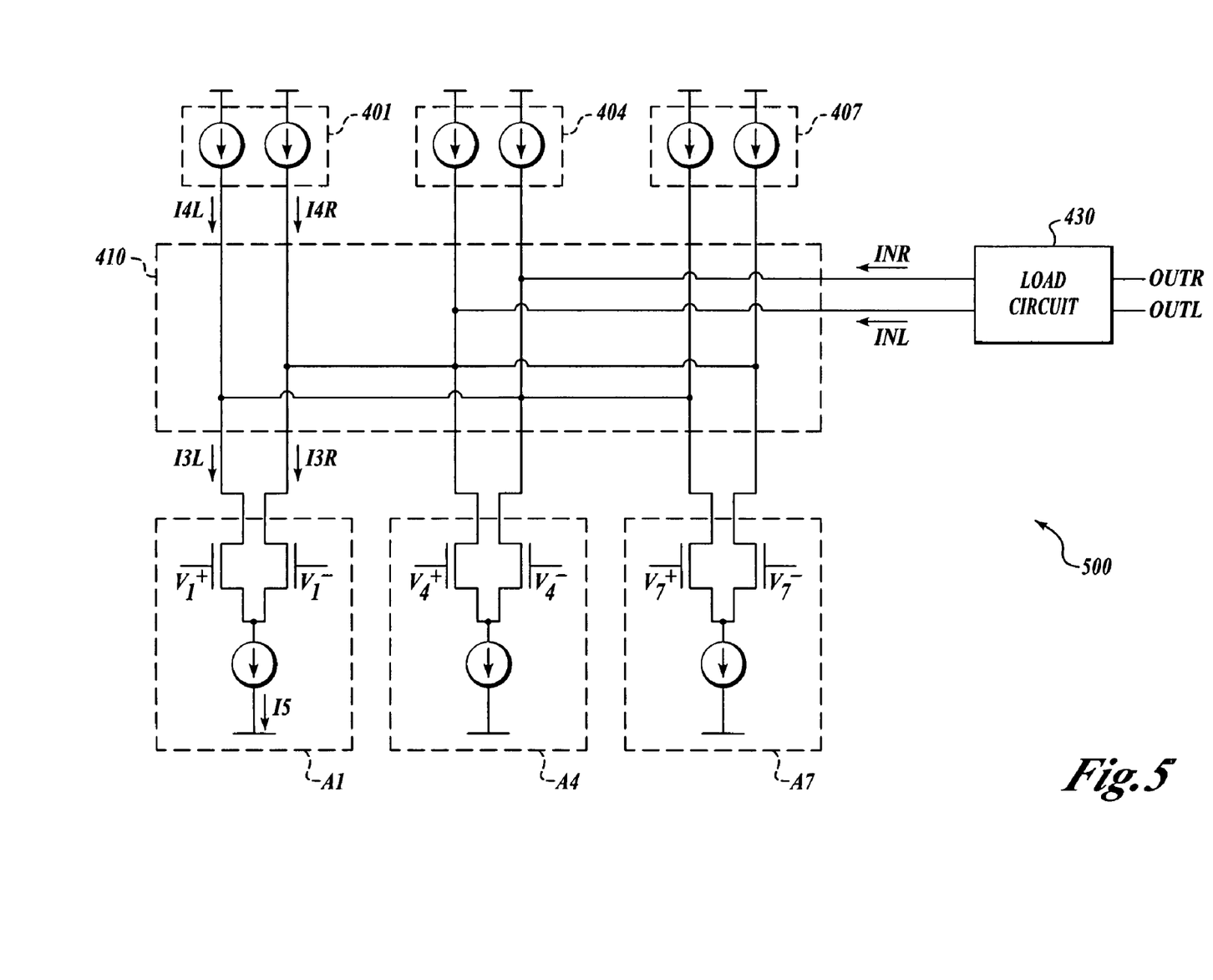
FIG. 5 schematically illustrates an embodiment of part of the circuit of FIG. 4.

FIG. 5 schematically illustrates an embodiment of a circuit (500) that represents a portion of circuit 320 as shown in FIG. 4. Circuit 500 includes amplifier circuits A1, A4, and A7, bus 410, current source circuits 401, 404, and 407, and load circuit 430.

In this embodiment, amplifier circuits A1, A4, and A7 are transconductance circuits. Each of the amplifier circuits A1, A4, and A7 include a differential pair and a tail current source. Current source circuits 401, 404, and 407 are differential current source circuits. Load circuit 430 is configured to provide a differential voltage (outl-outr) in response to a total differential current of the bus (inl-inr).

Amplifier circuit A1 is configured to provide a transconductance differential current (I31-I3r) in response to a differential input voltage (V1$^+$–V1$^{31}$). Current source 401 is configured to provide a local differential current (I4l-I4r). The tail current source of amplifier circuit A1 is configured to provide a tail current (I5).

Amplifier circuit A1 is configured to operate in a substantially similar manner as described with regard to amplifier circuit 112 shown in FIG. 1, albeit with some differences. Also, differential current source 401 is configured to operate in a substantially similar manner as described with regard to current source circuit 142 shown in FIG. 1, albeit with some differences. Additionally, bus 410 is configured to operate in a substantially similar manner as described with regard to bus 150, albeit with some differences. Moreover, load circuit 430 is configured to operate in a substantially similar manner as described with regard to load circuit 130, albeit with some differences. Furthermore, in this embodiment, Imax corresponds to I5.

Since the voltage input of the saturated amplifiers away from the crossing point is large, all but one of the amplifier circuits (A1, A4, and A7) are saturated during operation. That is, substantially all of the tail current in the saturated amplifiers flows through either the left or right branch of the differential pair towards one side of the load. The saturated amplifiers are saturated with opposite polarities such that their outputs cancel to zero and make substantially no contribution to the comparator input.

As noted previously, although an embodiment with three amplifier circuits coupled to a load circuit is shown, in other embodiments, virtually any number of amplifier circuits may be coupled to the load circuit without departing from the spirit and scope of the invention.

Figure 6:
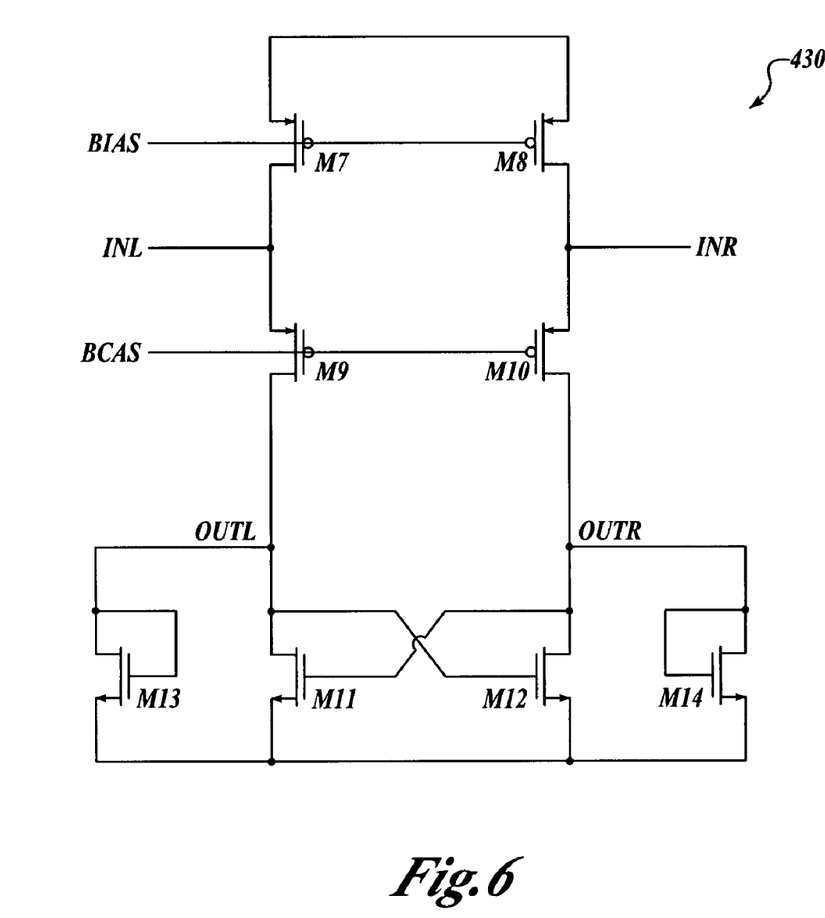
FIG. 6 schematically illustrates an embodiment of the load circuit of FIGS. 4 and 5, arranged in accordance with aspects of the invention.

FIG. 6 schematically illustrates an embodiment of load circuit 430 as shown in FIGS. 4 and 5. In this embodiment, load circuit 430 includes transistors M7–M14, arranged in a folded cascode architecture. Transistors M7 and M8 are configured as current sources. Also, transistors M7 and M8 each receive a bias signal (bias). Transistors M9 and M10 are cascode transistors that are biased by a cascode bias signal (bcas). Transistors M11 and M12 are arranged as cross-coupled load transistors. Although not shown, each of the other load circuits (431 and 432) illustrated in FIG. 4 may be arranged in a substantially similar manner as shown in FIG. 6 for load circuit 430.

Additionally, although FIG. 6 illustrates load circuit 430 in a folded cascode configuration, other types of load circuits may be used in other embodiments. For example, a telescopic cascode with current source loads, and the like, may be used in place of a folded cascode configuration. Also, in one embodiment, each of the current source circuits (401–409) may share a bias signal (bias) in common with the load circuit (430–432) that is physically closest to the current source circuit.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for reducing the current density on a bus coupled to a plurality of circuits, the circuit comprising:
   a folding amplifier array for a fine channel circuit of a folding analog-to-digital converter, wherein the folding amplifier array includes:
      a first amplifier circuit of the plurality of circuits, wherein the first amplifier circuit is configured to provide a first output current for the bus;
      a first current source circuit that is arranged to provide a first local current at an output of the first amplifier circuit such that at least a portion of the first output current is prevented from being carried on the bus;
      a second amplifier circuit of the plurality of circuits, wherein the second amplifier circuit is configured to provide a second output current for the bus; and
      a second current source circuit that is configured to provide a second local current at an output of the second amplifier circuit such that at least a portion of the second output current is prevented from being carried on the bus.

2. The circuit of claim 1, wherein the folding amplifier array further includes:
   a load circuit that is coupled to the bus.

3. The circuit of claim 1, wherein
   the first amplifier circuit is configured to provide the first output current to the bus in response to a first input voltage signal, and wherein
   the first output current is a differential current, and the first input voltage signal is a differential voltage signal.

4. The circuit of claim 1, wherein the following amplifier array further includes:
   a third amplifier circuit of the plurality of circuits, wherein the third amplifier circuit is configured to provide a third output current to the bus; and
   a third current source circuit that is configured to provide a third local current at an output of the third amplifier circuit.

5. The circuit of claim 4, wherein one of the amplifier circuits in the plurality of circuits is not saturated, and each of the other amplifier circuits in the plurality of circuits is saturated.

6. The circuit of claim 1, wherein the folding amplifier array further includes:
   another bus that is coupled to another plurality of circuits;
   another amplifier circuit of the other plurality of circuits, wherein the other amplifier circuit is configured to provide another output current for the other bus; and
   another current source circuit that is arranged to provide another local current at an output of the other amplifier circuit such that at least a portion of the other output current is prevented from being carried on the other bus.

7. The circuit of claim 1, wherein
   the first amplifier circuit includes:
      a first differential pair; and
      a first tail current source that is configured to provide a first tail current, and wherein the first local current corresponds to a fraction of the first tail current.

8. The circuit of claim 7,
   wherein the fraction of the first tail current is approximately half of the first tail current.

9. A circuit, comprising:
   an amplifier array circuit with a plurality of buses for a folding analog-to-digital converter circuit, wherein the amplifier array circuit is a folding amplifier array circuit for a fine channel stage of the folding analog-to-digital converter, the amplifier array circuit comprising:
      a plurality of transconductance circuits;
      a plurality of load circuits, wherein each of the plurality of load circuits is separately coupled to one of the plurality of buses,
      wherein a first bus of the plurality of buses is coupled to a portion of the plurality of transconductance circuits;
      a first current source circuit, wherein the first current source circuit is coupled to an output of a first of the portion of the plurality of transconductance circuits, and wherein the first current source circuit is arranged to provide a first local current at the output of the first transconductance circuit such that a maximum magnitude of current density is decreased on at least the first bus of the plurality of buses; and
      another current source circuit that is coupled to an output of another transconductance circuit in the portion of transconductance circuits.

10. The circuit of claim 9, wherein
    one of the portion of the transconductance circuits is not saturated, and
    wherein every other transconductance circuit in the portion is saturated.

11. The circuit of claim 9, further comprising:
    a plurality of current source circuits that includes the first current source circuit,
    wherein each of the plurality of transconductance circuits has an output coupled to a separate one of the plurality of current source circuits.

12. The circuit of claim 11, wherein
    each of the plurality of transconductance circuits is configured to provide a separate transconductance current on one of the plurality of buses, and wherein
    each of the plurality of current source circuits is configured to supply a separate local current such that at least a portion of the output current from each of the plurality of transconductance circuits is prevented from being carried on each of the plurality of buses.

13. The circuit of claim 9, wherein
the first transconductance circuit is configured to provide the first transconductance current in response to a differential voltage;
the first transconductance current is differential; and wherein
the first local current is differential.

14. The circuit of claim 9, wherein
the first transconductance circuit includes:
a first differential pair; and
a first tail current source that is configured to provide a first tail current, and wherein the first local current corresponds to a portion of the first tail current.

15. The circuit of claim 14,
wherein the portion of the first tail current is approximately half of the first tail current.

16. An amplifier array circuit with a plurality of buses for a folding analog-to-digital converter circuit, the amplifier array circuit comprising:
a plurality of transconductance circuits;
a plurality of load circuits, wherein each of the plurality of load circuits is separately coupled to one of the plurality of buses,
wherein a first bus of the plurality of buses is coupled to a portion of the plurality of transconductance circuits;
a first current source circuit, wherein the first current source circuit is coupled to an output of a first of the portion of the plurality of transconductance circuits, and wherein the first current source circuit is arranged to provide a first local current at the output of the first transconductance circuit such that a maximum magnitude of current density is decreased on at least the first bus of the plurality of buses; and
a plurality of current source circuits that includes the first current source circuit, wherein each of the plurality of transconductance circuits has an output coupled to a separate one of the plurality of current source circuits, wherein each of the plurality of load circuits includes a load current source, and
wherein each of the plurality of current source circuits shares a bias line in common with one of the load current sources.

17. A circuit for decreasing current density on a bus coupled to a plurality of circuits, the circuit comprising:
means for folding analog-to-digital conversion, including:
means for amplifying a first input signal to provide a first current to the bus;
means for providing a first local current;
means for canceling out at least a portion of the first current with the first local current such that a maximum magnitude of a total current on the bus is reduced;
means for amplifying a second input signal to provide a second current to the bus;
means for providing a second local current; and
means for canceling out at least a portion of the second current with the second local current such that a maximum magnitude of a total current on the bus is reduced.

18. A circuit for reducing the current density on a bus coupled to a plurality of circuits, the circuits comprising:
a first amplifier circuit of the plurality of circuits, wherein the first amplifier circuit has at least an output that is connected to the bus, and wherein the first amplifier circuit is configured to provide a first output current at the output of the first amplifier circuit;
a first current source circuit having at least an output, wherein the output of the first current source circuit is connected to the bus, and wherein the first current source circuit is arranged to provide a first local current at an output of the first current source circuit such that at least a portion of the first output current is prevented from being carried on the bus;
a second amplifier circuit of the plurality of circuits, wherein the second amplifier circuit has at least an output that is connected to the bus, and wherein the second amplifier circuit is configured to provide a second output current at the output of the second amplifier circuit; and
a second current source circuit having at least an output, wherein the output of the second current source circuit is connected to the bus, and wherein the second current source circuit is arranged to provide a second local current at an output of the second current source circuit such that at least a portion of the second output current is prevented from being carried on the bus.

19. The circuit of claim 18, wherein the bus is composed of metal having substantially no resistance.

20. The circuit of claim 18, further comprising:
a load circuit that is connected to the bus.

21. The circuit of claim 20, wherein the load circuit is configured to provide an output voltage such that the output voltage is substantially equal to the multiplicative product of: the bus current, and an impedance of the load circuit.

22. The circuit of claim 20, wherein the load circuit does not include averaging impedances.

23. The circuit of claim 20, wherein the load circuit is coupled to a supply voltage.

24. A circuit for reducing the current density, comprising:
a first bus, a second bus, a third bus, and a fourth bus;
a first amplifier circuit that is arranged to provide a first differential current, wherein the amplifier circuit is arranged to provide a first half of the first differential current to the first bus, and to provide a second half of the first differential current to the second bus, wherein the first amplifier circuit has at least a first output that is coupled to the first bus and a second output that is coupled to the second bus;
a second amplifier circuit that is arranged to provide a second differential current, wherein the amplifier circuit is arranged to provide a first half of the second differential current to the first bus, and to provide a second half of the second differential current to the second bus, wherein the second amplifier circuit has at least a first output that is coupled to the first bus and a second output that is coupled to the second bus;
a third amplifier circuit that is arranged to provide a third differential current, wherein the amplifier circuit is arranged to provide a first half of the third differential current to the third bus, and to provide a second half of the third differential current to the fourth bus, wherein the third amplifier circuit has at least a first output that is coupled to the third bus and a second output that is coupled to the fourth bus;
a first current source circuit that is arranged to provide a first local current at the first output of the first amplifier circuit such that at least a portion of the first half of the first differential current is prevented from being carried on the first bus;
a second current source circuit that is arranged to provide a second local current at the second output of the first amplifier circuit such that at least a portion of the second half of the first differential current is prevented from being carried on the second bus;

a third current source circuit that is arranged to provide a third local current at the first output of the third amplifier circuit such that at least a portion of the first half of the third differential current is prevented from being carried on the third bus; and a fourth current source circuit that is arranged to provide a fourth local current at the second output of the fourth amplifier circuit such that at least a portion of the second half of the third differential current is prevented from being carried on the fourth bus.

* * * * *

UNITED STATES PATENT AND TRADEMARK OFFICE
CERTIFICATE OF CORRECTION

PATENT NO. : 7,236,115 B1
APPLICATION NO. : 10/763561
DATED : June 26, 2007
INVENTOR(S) : Menkus et al.

It is certified that error appears in the above-identified patent and that said Letters Patent is hereby corrected as shown below:

In column 1, line 30, delete "folding" and insert -- folded --, therefor.

In column 2, line 63, after "can" delete "be".

In column 3, line 5, delete "of" and insert -- on --, therefor.

In column 4, line 32, delete "$(V1^+ - V1^{31})$." and insert -- $(V1^+ - V1^-)$. --, therefor.

In column 5, line 55, in Claim 4, delete "following" and insert -- folding --, therefor.

In column 7, line 62, in Claim 18, delete "circuits" (second occurrence) and insert -- circuit --, therefor.

Signed and Sealed this

Eighteenth Day of September, 2007

JON W. DUDAS
*Director of the United States Patent and Trademark Office*